United States Patent [19]

Brown et al.

[11] Patent Number: 4,583,228

[45] Date of Patent: Apr. 15, 1986

[54] FREQUENCY STABILIZATION OF LASERS

[75] Inventors: Michael G. Brown, Berkely Heights; Richard G. Smith, Basking Ridge, both of N.J.

[73] Assignee: AT&T Bell Laboratories, Murray Hill, N.J.

[21] Appl. No.: 554,062

[22] Filed: Nov. 21, 1983

[51] Int. Cl.[4] .............................................. H01S 3/10
[52] U.S. Cl. ....................................................... 372/32
[58] Field of Search ................... 372/32, 29, 44, 38; 250/205; 455/611

[56] References Cited

FOREIGN PATENT DOCUMENTS 0147291 9/1982 Japan ................................... 372/38

OTHER PUBLICATIONS

T. Baer et al, "Frequency Stabilization of a 0.633-$\mu$m He—Ne Longitudinal Zeeman Laser", *Applied Optics,* vol. 19, pp. 3173-3177 (Sep. 1980).
H. Tsuchida et al, "Improvements in the Short-Term Frequency Stability of AlGaAs DH Lasers", *Transactions of IECE of Japan,* vol. E65, pp. 65-66 (Jan. 1982).
H. Tsuchida et al, "Frequency Stabilization of AlGaAs DH Lasers", *Japanese Journal of Applied Physics,* vol. 20, pp. L403-L406 (Jun. 1981).
S. Sampei et al, "Frequency Stabilization of AlGaAs Semiconductor Lasers with External Grating Feedback", *Japanese Journal of Applied Physics,* vol. 22, pp. L258-L260 (Apr. 1983).

*Primary Examiner*—James W. Davie
*Attorney, Agent, or Firm*—Lester H. Birnbaum

[57] ABSTRACT

Apparatus including a semiconductor laser source and means for stabilizing the frequency of the laser. A feedback signal is provided by means such as a Fabry-Perot interferometer, which signal is coupled simultaneously to two feedback loops. One loop provides high frequency control of the drive current while the other loop provides low frequency control of the laser temperature.

10 Claims, 3 Drawing Figures

FREQUENCY STABILIZATION OF LASERS

BACKGROUND OF THE INVENTION

This invention relates to semiconductor laser apparatus, and in particular to a means of achieving a highly stable laser output frequency.

At the present time, lightwave communications systems generally employ a base band amplitude-shift-keyed operation. That is, the laser is turned on and off so that the presence of a pulse constitutes a binary "1" and the absence of a pulse constitutes a binary "0". In such systems, even single-mode lasers are not truly coherent since turning the device on and off will vary the frequency.

While such systems are generally adequate for present communication systems, several advantages would accrue if a coherent system were employed. In such a system the laser carrier frequency is well controlled and the information is impressed on the carrier by changes in the frequency, phase or amplitude of the light signal. For example, higher capacity wavelength division multiplexing could be employed due to the well-defined frequency of each channel. In addition, a highly stable local oscillator may be used to implement a homodyne or heterodyne system resulting in greater receiver sensitivity and increasing the permissible spacing between repeaters.

In the semiconductor laser art, it is known to employ a Fabry-Perot interferometer to detect changes in the laser frequency and to use this signal in a feedback loop to control the temperature or drive current of the laser (See, e.g., Tsuchida et al, "Improvements in the Short-term Frequency Stability of AlGaAs DH Laser," *Transactions of IECE of Japan,* Vol. E65, pp. 65–66 (January 1982).) However, as far as applicants are aware, a high degree of stability in prior art methods was achieved only by very complex electronic feedback loops.

In gas laser systems, it has also been proposed to employ a Fabry-Perot interferometer in a double feedback loop to control the length of the laser cavity by coupling one loop to a piezoelectric device and the other loop to a heater. (See Baer et al, "Frequency Stabilization of a 0.633 μm He—Ne Longitudinal Zeeman Laser," *Applied Optics,* Vol. 19, pp. 3173–3177 (September 1980).)

It is a primary object of the invention to provide a feedback system for producing a highly stable output frequency from a semiconductor laser.

SUMMARY OF THE INVENTION

This and other objects are achieved in accordance with the invention which is a laser apparatus comprising a semiconductor laser light source, current means for driving the laser source, means for controlling the temperature of the laser source, and means for providing a feedback signal to stabilize the frequency of the light output from the laser source. The feedback signal means comprises means for producing an electrical output signal in response to changes in the frequency of the output from the light source and at least two feedback loops electrically coupled to the electrical output signal. One of the feedback loops is adapted to couple relatively fast changes in the output signal to the current means driving the laser source and the other feedback loop is adapted to couple relatively slow changes in the output signal to the temperature control means.

BRIEF DESCRIPTION OF THE DRAWING

These and other features of the invention are delineated in detail in the description to follow. In the drawing.

DETAILED DESCRIPTION

Figure 1:
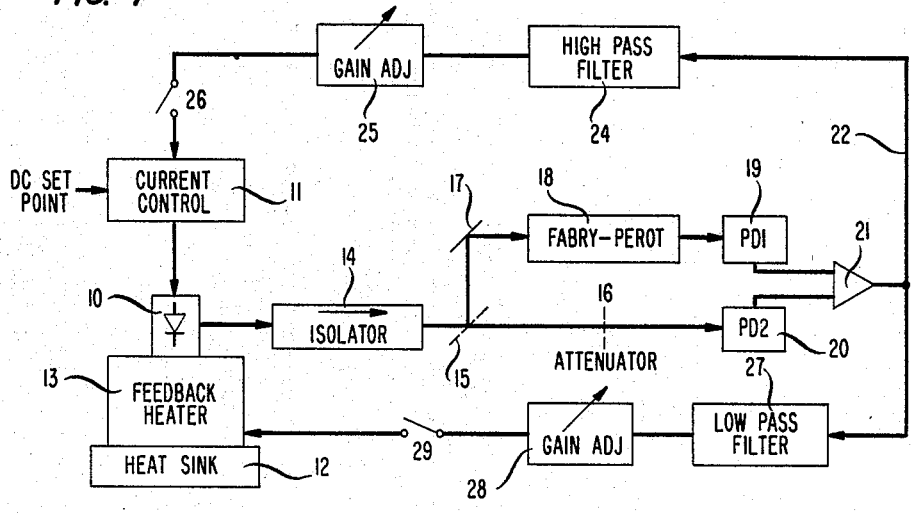
FIG. 1 is a schematic diagram of the laser apparatus in accordance with one embodiment of the invention.

The basic principles of the invention will be described with reference to the schematic illustration shown in FIG. 1. Since the precise physical and electrical components of the elements in FIG. 1 are generally known, they are shown only schematically.

The apparatus included a semiconductor laser source, 10, which was driven by a means for providing a controlled current, 11. In this particular example, the laser was a commercially available AlGaAs laser emitting a single longitudinal mode at a wavelength of approximately 0.83 μm. However, the invention should be applicable to all types of semiconductor lasers.

Figure 2:
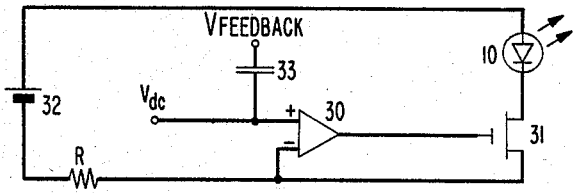
FIG. 2 is a circuit diagram of current means for driving the laser in accordance with the same embodiment.

The current control means, as illustrated in the circuit diagram of FIG. 2, was a constant current source where the current through resistor, R, was kept constant by an operational amplifier, 30, with its output coupled to the gate of an FFT, 31. One input of the amplifier was coupled to the source of the FET and the other input was coupled to a dc set point potential, $V_{dc}$, and through a capacitor, 33, to one of the feedback loops to be described. The bias potential to the laser, 10, was supplied by a battery, 32, although any stable current supply of sufficient capacity could be used. Thus, the current supplied to the laser was a function of the sum of the currents due to the dc set point potential and the current from the feedback loop.

Returning to FIG. 1, the laser was mounted on a heat sink, illustrated as the single box, 12, so that the laser resided on an isothermal surface. Actually, the heat sink included a multi-layer structure including a first copper heat sink on which the laser stud was mounted, a heater adjacent to the opposite surface of the first heat sink, a second heat sink adjacent to the opposite surface of the heater, a thermoelectric cooler adjacent to the second heat sink and a water-cooled heat sink adjacent to the cooler. The precise structure of the heat sink is not believed to be significant as long as the surface is isothermal (i.e., the temperature preferably varies no more than 0.01 degrees C.). Also mounted in close proximity to the laser was a feedback heater, illustrated as box 13, which was responsive to changes in current supplied thereto. [In this example, the heater was a commercially-available 50 ohm stripline resistor which was attached to the side of the laser stud approximately 1 mm from the laser.]

The light output of the laser was collimated and was made incident through a standard optical isolator, 14, employing Faraday rotation, onto a beam splitter, 15, which split the output into a reference beam and a frequency-determining beam. The reference beam was directed through an attenuator, 16, onto a standard silicon PIN photodiode (PD2), 20, to convert the light output to a corresponding electrical signal. The attenuator was adjusted in this example to reduce the beam intensity by approximately 70% so that a zero output would be achieved from differential amplifier, 21, when the laser frequency is within the linear portion of the passband of Fabry-Perot interferometer, 18, to be described. Thus, the attenuator permits adjustment of the laser output frequency with respect to the passband of the interferometer.

The frequency-determining beam was directed by a mirror, 17, onto the Fabry-Perot interferometer, 18. The interferometer in this example was a standard confocal design with a free spectral range of 750 MHz and a finesse of approximately 30. The interferometer should be capable of discriminating frequency changes of 1 MHz or less. In general, an interferometer with a passband having a full width half maximum (FWHM) of less than 50 MHz would be suitable, where FWHM is the free spectral range divided by the finesse. The term "Fabry-Perot interferometer" is intended to include any interferometer which includes a pair of spaced, flat or curved, parallel mirrors so that inteference fringes are produced by multiple reflection of light between the mirrors. The interferometer was adjusted by varying the voltage to a piezoelectric element (not shown) onto which one of the interferometer mirrors was mounted so that one of its passbands overlapped the laser frequency. Thus, the amplitude of the output beam of the interferometer was proportional to the frequency of the laser input beam. The light output of the interferometer was made incident on a silicon PIN photodiode (PD1), 19, so that an electrical signal proportional to the light amplitude was obtained.

The two photodiodes, 19 and 20, were electrically coupled to respective inputs of a differential amplifier, 21, to produce an electrical feedback signal at the output of the amplifier whenever the amplitude from the photodiodes differed as a result of a change in laser frequency. This feedback signal was simultaneously coupled to two feedback loops. One loop, 22, electrically coupled the feedback signal from the amplifier to a high pass filter, 24, so that only relatively fast changes in the signal would operate in this loop. In this example, the passband of the filter was from 10 Hz to 1 kHz, but this value can be adjusted according to particular needs. The voltage of the feedback signal in this loop was adjusted by gain adjustment element, 25, which in this example was a standard potentiometer, to avoid pushing the laser frequency off the passband of the interferometer. The signal was electrically coupled through switch, 26, to the current control circuit 11, which drives the laser so that the drive current was adjusted in response to the signal in this feedback loop.

The second loop, 23, electrically coupled the feedback signal from the differential amplifier to a low pass filter, 27, so that only relatively slow changes in the signal operate in this loop. In this example, the passband was up to approximately 20 Hz but, again, this will vary according to particular needs. As in the first loop, the voltage was adjusted by a gain adjustment element (potentiometer), 28. In this loop, the signal was coupled through a switch, 29, to the feedback heater, 13, so that the temperature of the laser was adjusted in response to the feedback signal. That is, the heat generated by the heater was directly proportional to the current supplied. It should be appreciated that, in practice, a low pass filter may not be necessary in this loop since the available heaters will usually respond slowly to current changes.

In one particular run, the laser heat sink, 12, was set at approximately 16 degrees C. and a current of approximately 100 mA (1.3 times the laser threshold) was applied to the laser by current control means, 11. The interferometer was adjusted so that one of the passbands overlapped the laser frequency, the feedback loops were engaged by closing switches, 26 and 29, and the gain adjustment elements, 25 and 28, were set.

Figure 3:
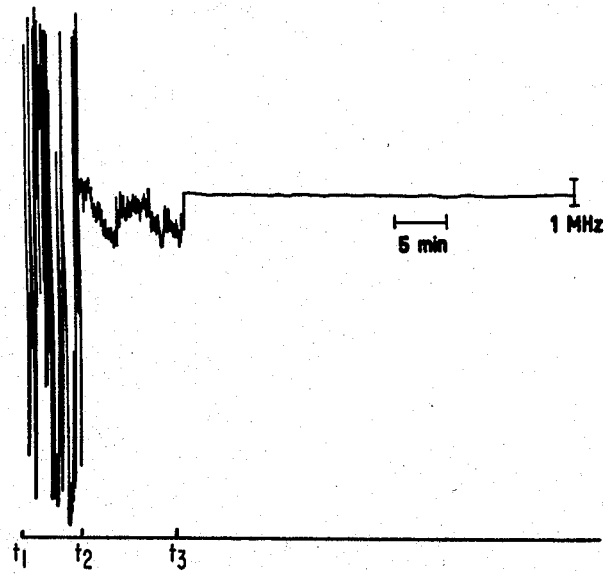
FIG. 3 is a strip chart recording of the electrical output signal from the apparatus of FIG. 1 at various times during operation.

The output from the photodiode, 19, was monitored by a strip chart recorder and spectrum analyzer (not shown). The strip chart recording is reproduced as FIG. 3 with a time axis, an indication of the time scale (horizontal bar), and an indication of the frequency scale (vertical bar) superimposed thereon. During time interval $t_1$ to $t_2$, the laser was permitted to run freely and frequency variations of at least $\pm 100$ MHz were recorded. At time $t_2$, the thermal feedback loop, 23, was closed and the laser stabilized to a frequency range of approximately $\pm 1$ MHz. Finally, at time $t_3$, both loops were closed and the laser exhibited a highly stable frequency of much less than $\pm 1$ MHz. In this example, the short-term stability was approximately 30 KHz. In general, a short-term stability of 1 MHz or less is desirable for use in coherent systems.

In addition, the spectrum analyzer, which plots noise amplitude versus frequency, showed that the noise level of the laser output was not significantly affected by the thermal feedback loop alone, at frequencies greater than 50 Hz. However, use of both loops reduced the noise by 20 to 30 dB. Thus, the feedback loops control both the average laser frequency (measured by the strip chart recorder) and the instantaneous changes in frequency (measured by the spectrum analyzer).

Stabilization experiments were monitored for over 30 minutes with no significant change in the stabilization of the laser under the control of both feedback loops. That is, long-term drift of the center frequency of the laser was held to less than $\pm 1$ MHz with respect to the Fabry-Perot passband.

It will be appreciated that, although a Fabry-Perot interferometer is preferred in this invention, in principle other means for detecting changes in the laser frequency might be employed. Furthermore, although the electrical output signal for the feedback loops is provided by a differential amplifier, 21, which measures the difference between the output of PD1 and PD2 in this embodiment, it may be advantageous to employ a divider circuit to measure the ratio of the output from PD1 and PD2 to cancel out effects due to intensity variations from the laser.

Various additional modifications of the invention will become apparent to those skilled in the art. All such variations which basically rely on the teachings through which the invention has advanced the art are properly considered within the spirit and scope of the invention.

What is claimed is:
1. Laser apparatus comprising
a semiconductor laser light source;
current means for driving the laser source;
means for controlling the temperature of the laser; and
means for providing a feedback signal to stabilize the frequency of the light output from said laser source comprising:

means for producing an electrical output signal in response to changes in the frequency of the output from the light source; and at least two feedback loops electrically coupled to said electrical output signal, one of said feedback loops adapted to couple relatively fast changes in the output signal to the current means driving said laser source and the other feedback loop adapted to couple relatively slow changes in the output signal to the temperature control means.

2. Apparatus according to claim 1 wherein the means for producing an electrical output signal in response to changes in laser frequency includes a Fabry-Perot interferometer optically coupled to said laser.

3. Apparatus according to claim 2 wherein the means for producing an electrical output further includes a first optical detector optically coupled to the output of the Fabry-Perot interferometer, a second optical detector optically coupled to a reference beam, and means for comparing the electrical output of the two detectors.

4. Apparatus according to claim 3 wherein the means for comparing the output of the detectors comprises a differential amplifier.

5. Apparatus according to claim 1 wherein the current means is a constant current source and the said one feedback loop is coupled to the current source so that the output of the current source is proportional to the sum of the current from the feedback loop and from a fixed dc voltage.

6. Apparatus according to claim 1 wherein the feedback loops include means for controlling the voltage of the feedback signals.

7. Apparatus according to claim 1 wherein the said one feedback loop includes a high pass filter and the said other feedback loop includes a low pass filter.

8. Apparatus according to claim 1 wherein the short-term and the long-term frequency stabilization of the laser is less than 1 MHz.

9. Apparatus according to claim 1 wherein the instantaneous changes in frequency of the laser are controlled by the feedback loop coupled to the current means so that the frequency noise amplitude of the laser is reduced by at least 20 dB.

10. Apparatus according to claim 2 wherein the passband of the interferometer has a full width half maximum of less than 50 MHz.

* * * * *